United States Patent
Williford et al.

(10) Patent No.: US 7,148,459 B2
(45) Date of Patent: Dec. 12, 2006

(54) PHOTON ENERGIZED CAVITY AND SYSTEM

(75) Inventors: Robert John Williford, Melbourne, FL (US); Arecio A. Hernandez, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 325 days.

(21) Appl. No.: 10/883,319

(22) Filed: Jul. 1, 2004

(65) Prior Publication Data

US 2006/0000970 A1  Jan. 5, 2006

(51) Int. Cl.
*H01J 40/14* (2006.01)

(52) U.S. Cl. ..................... 250/207; 250/214.1
(58) Field of Classification Search ............... 250/207, 250/214.1
See application file for complete search history.

(56) References Cited

U.S. PATENT DOCUMENTS 5,376,893 A * 12/1994 Etievant et al. ............. 315/501

OTHER PUBLICATIONS

Christopher L. Templeman, "The Compton Effect", May 5, 2000; pp. 1-3, Physics Department, The College of Wooster, Wooster, Ohio 44691.

* cited by examiner

*Primary Examiner*—Que T. Le
(74) *Attorney, Agent, or Firm*—GrayRobinson, P.A.

(57) ABSTRACT

In a first exemplary embodiment of the invention, an externally and photonically energized unit comprises a shaped resonant cavity, with selected material for converting the incident photons into other electromagnetic radiation for resonance within the cavity; and a pick-up element for receiving and applying the resonant electromagnetic radiation to one or more components external to the resonant cavity. In a wideband modulation mode, the resonant cavity contains a modulation element to which a first information signal is applied. When photons, such as from an x-ray burst, traverse the resonant cavity, a wideband RF signal is generated within the resonant cavity which is modulated by the information signal. In further embodiments, the resonant cavities provide local power based on the remotely sourced photonic wave, as well as enhanced detectors.

30 Claims, 4 Drawing Sheets

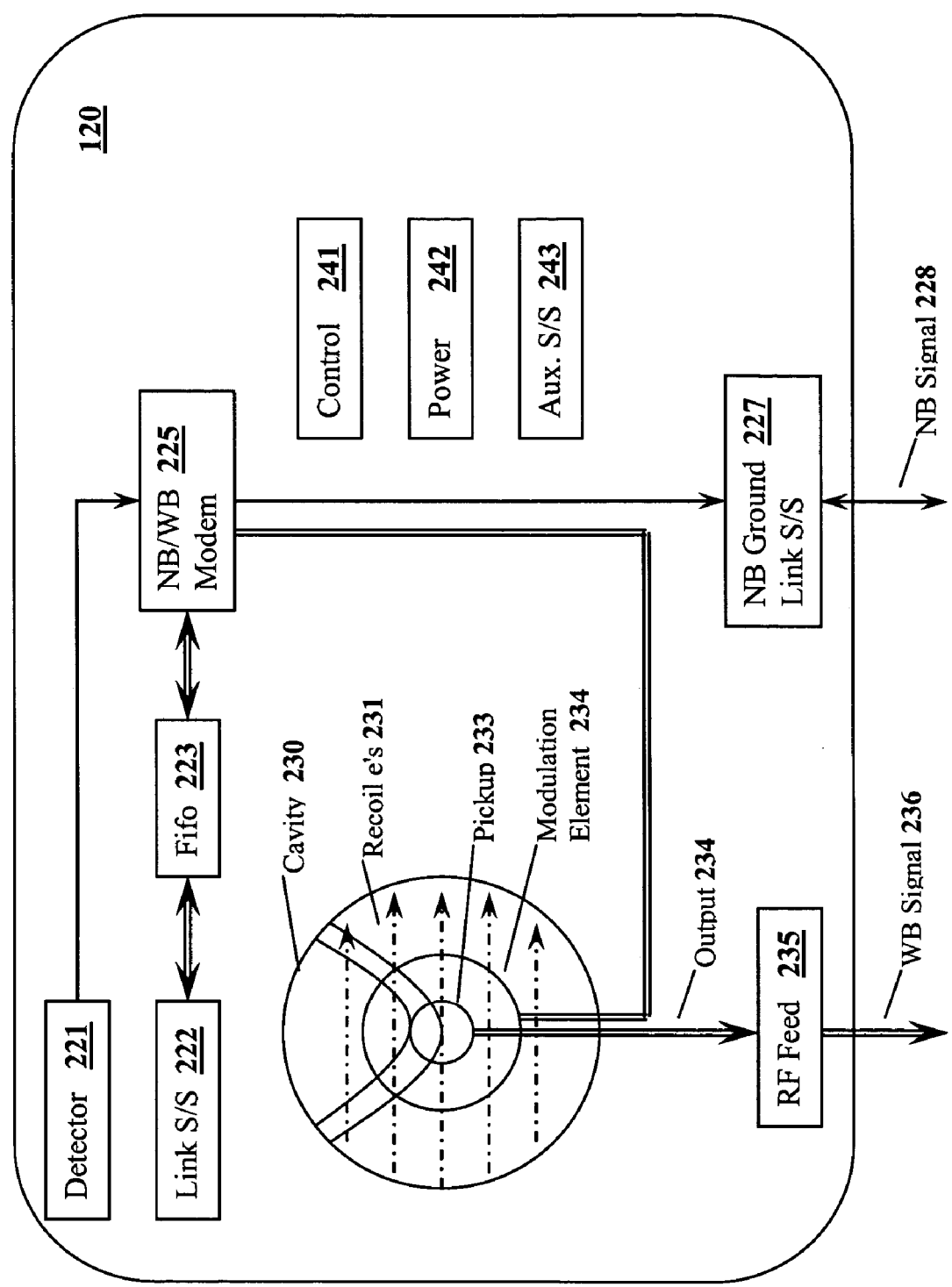
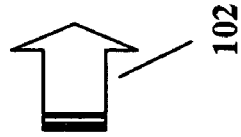
FIG. 2

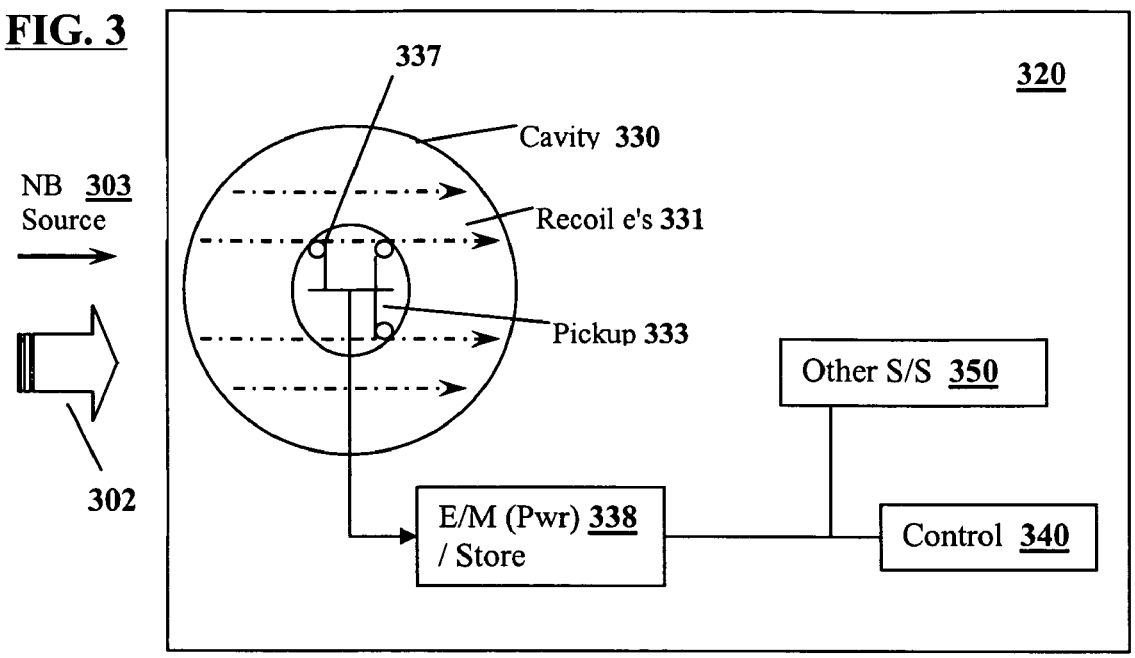
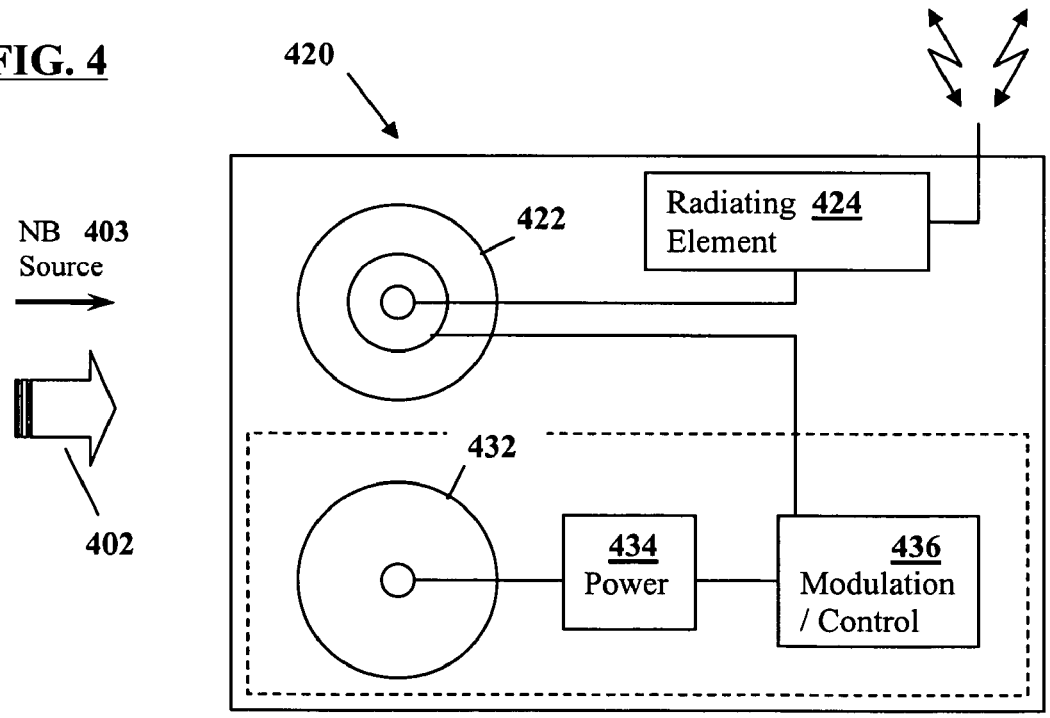

PHOTON ENERGIZED CAVITY AND SYSTEM

TECHNICAL FIELD

Our invention generally relates to electronic systems and, more specifically, the invention is related to the field of photonics, as well as communications, power, and detection systems.

BACKGROUND OF THE INVENTION

One of the perennial challenges for many electronics programs is how to reduce the size and weight of the electronics components. This is important for large systems, such as aircraft and spacecraft, where every savings yields increased payload and mission capabilities. It is equally important for miniature systems, like in vivo medical devices and micro-miniature detectors, where each reduction opens a range of applications previously inaccessible at larger scales.

One of the key constraints on any such system is the demand for some form of local energy to power the electronics. The common solutions include some form of fuel-based power generation (e.g., chemical or nuclear systems), or a storage device (e.g., batteries). Alternative sources, like photovoltaic panels, are also common in specialized applications such as space systems. However, in all of these cases significant amounts of volume and weight are necessarily taken up by the power subsystem components.

While resonant cavities are well known in certain fields, they have not been used to help meet this key challenge. Microwave ovens and lasers are two of the better known examples where resonant cavities are used, but in both these cases the resonant features of the cavity are being used to act as a filter or power amplifier for a locally generated signal. In the case of the microwave ovens, the anode veins serve to define the resonant cavities, which in-turn determine the frequencies that are output when the magnetron is energized. In the typical laser, the laser cavity is formed to allow for optical resonance between a mirrored and a partially mirrored surface. When light is injected into the laser cavity via an exciting element (e.g., a flash tube), the light resonates in the cavity/lasing medium until it has been amplified enough to be emitted as a coherent laser beam. Thus, in both cases, the devices depend on local exciting means. The magnetrons depend upon an interaction of the anode vein-formed cavities with the electrons emitted from the cathode filament and the permanent magnetic field. The lasers depend upon some form of electromagnetic or other pumping means to inject this energy into the lasing medium.

A more recent use of resonant cavities has been to enhance photodetectors. In these devices, the cavity serves to recycle photons at the resonant wavelength, so the quantum efficiency of the photodetectors are dramatically increased. However, these typically rely on a limited range of materials and structures (e.g., vertical photodetector structures, with GaAs or GeSi resonant layers between a reflective layer and the photoabsorption layer), and the photoabsorption layer is the only active layer in the structure. These also remains dependent on local power sources in order to operate.

Thus, in these and other prior art approaches, the use of resonant cavities has been limited to filtering or enhancing locally powered output signals (e.g., magnetrons, lasers), or filtering or enhancing weak signals enough for detection by a locally powered detector. Thus, significant active componentry is still required to drive or extract the desired outputs.

In all these applications, resonant cavities have not been used reduce or eliminate reliance on other local power components. This, together with an advantageous reduction in system size and weight, as well as other challenges addressed in the detailed description below, are solved through our invention.

SUMMARY OF THE INVENTION

In a first exemplary embodiment of the invention, an externally and photonically energized device comprises an appropriately shaped resonant cavity, with selected material part of the resonant cavity for converting photon energy into other electromagnetic radiation for resonance within the cavity; and a pick-up element for receiving and applying the resonant electromagnetic radiation to one or more components external to the resonant cavity. In a wideband modulation mode, the resonant cavity contains a modulation element to which a first information signal is applied. When photons, such as those created in an x-ray burst, traverse the resonant cavity, a wideband RF signal is generated within the resonant cavity. This RF signal is modulated by the information signal, and received by the pick-up element, which in turn applies it to an external RF feed. Thus, a low power, low-bandwidth unit is able to produce a high bandwidth burst whenever the external energy source is applied.

In a further embodiment, a resonant cavity can be used to capture electromagnetic radiation and apply it to an energy store, thereby converting an external source of energy into locally stored energy without the use of expensive elements such as photovoltaic cells and solar panel arrays. In yet further embodiments, multiple resonant cavities can be combined together, thus providing arrays for specialized/directional pick-up from external energy events, as well as combined energy capture and information transfer subsystems into a single miniaturized device. In doing so, resonant cavities can be used as both specialized detectors and as significant sources of electromagnetic energy to drive the desired system output.

BRIEF DESCRIPTION OF THE DRAWINGS

The invention may be more readily appreciated from the following detailed description, when read in conjunction with the accompanying drawings, in which:

FIG. 2 is a block diagram of the pod according to the embodiment of FIG. 1

FIG. 3 is a block diagram of a second embodiment of the invention in which the resonant cavity serves to provide power to the remote unit.

FIG. 4 is a block diagram illustrative of a third embodiment of the invention combining plural resonant cavities used in different modes.

DETAILED DESCRIPTION OF THE PREFERRED EMBODIMENTS

In accordance with the presently preferred embodiments of the invention described below, a variety of devices are disclosed in which resonant cavities are used to capture photonic energy and harness it. In these exemplary applications the function of a resonant cavity is enhanced by the shape and material(s) used in structuring the cavity. As photons at the desired wavelengths strike the cavity wall(s), the photons drive Compton recoil electrons from the materials across the cavity. This in turn causes the cavity to ring at its resonant electromagnetic frequency. This energy is captured by an appropriate pick-up element and channeled to the selected subsystem, whether a datalink, an energy storage device, or other electromagnetic subsystem. Thus, smaller and lighter systems are possible for applications, large and small, where external photonic energy is available in sufficient levels to energize the electromagnetic subsystems.

Figure 1:
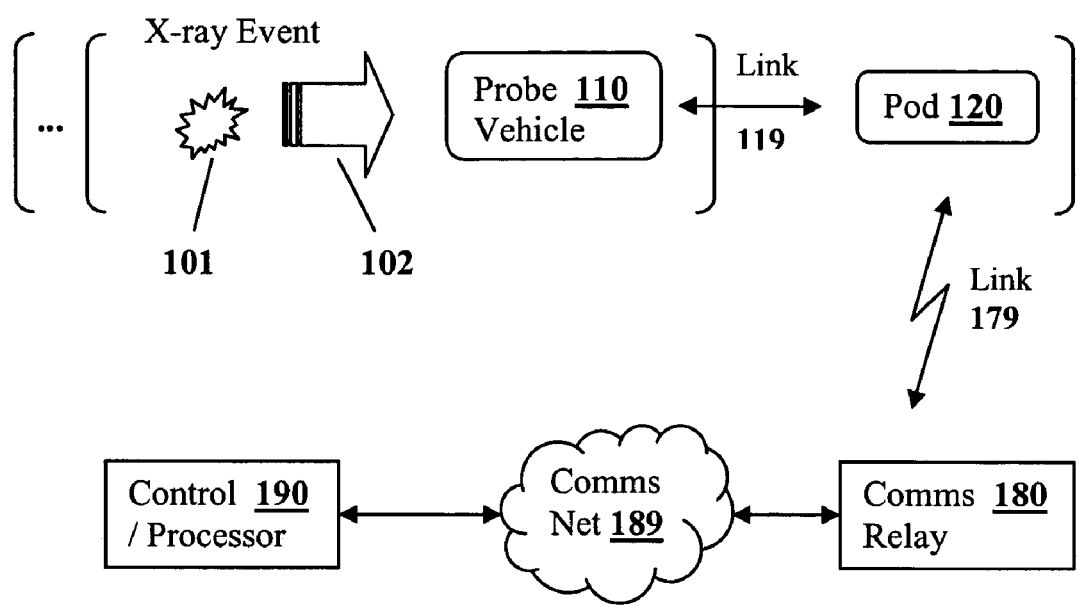
FIG. 1 is a block diagram of the basic system in which a pod containing the resonant cavity is used to capture and transmit a high bandwidth burst concerning a high altitude x-ray event, according to a first preferred embodiment of the invention.

Turning now to FIG. 1, a first embodiment of the invention is illustrated in connection with a space-based system 110, and in particular one capable of detecting and reporting a high-energy x-ray event. In such systems, it may be advantageous to use a detachable pod 120 for final communications with the ground station, since the main vehicle 110 may be too close to the x-ray event to accomplish a high-bandwidth dump before its electronic systems are compromised. The vehicle 110 could be a satellite, a station, or even an intercept vehicle for a hostile missile. In the latter case, the intercept vehicle would include some form of device for destroying the target (like a sub-orbital warhead), and would need to get in immediate proximity to the missile in order to destroy the target. Yet no matter how well designed such systems are, it is possible that the warheads will be detonated in the process, whether through only partial damage to the missile, an early trigger mechanism, or other cause. If this happens, it is critical that as much information about the detonation get to ground systems as fast as possible. However, in the case of nuclear detonations any such event will include a plasma wave of sufficient speed and force to destroy any vehicle in close proximity (e.g., under 1 km) before the detonation can be detected and communicated with current communication systems.

By using a detachable pod 120, sufficient time can be achieved to permit a final high-bandwidth transmission. Again, using the example of an intercept vehicle, this pod 120 can be detached minutes or even seconds before the expected intercept, allowing for a several kilometer or more separation from the main vehicle 110 at intercept. In so doing, a millisecond or so is now available for information from local detectors and/or buffered information from the main vehicle to be relayed to the ground. While important, this is not enough for current systems, since a detachable pod by its nature will need to be kept as small as possible, and it would be undesirable to have a traditional power system on board to power the broadband communications subsystem. A small power system may still be present, for example, to power a narrowband ground link 179 to earth communications relay 180 if the interception is successful, or even to support a local high-bandwidth link 119 from probe vehicle 110 (e.g., via an optical link) between detachment and intercept. But, the power for a final broadband transmission needs a different power source—such as may now be provided by a relatively small and lightweight resonant cavity.

One of the features of a high-altitude nuclear blast 101 is that the destructive plasma wave is preceded by a more rapidly propagating high-energy x-ray wavefront 102. If there is a warhead detonation, the pod 120 may have between several microseconds to several milliseconds (depending on the distance of the pod 120 to the x-ray event 101) from the arrival of this x-ray wavefront 102 before it is hit by the plasma wave. This is sufficient time, using the resonant cavity according to the present invention, for pod 120 to generate a high bandwidth signal for a complete data dump across link 179 to the ground systems connected to the communications network 189 which are interested in analyzing the interception and partial detonation.

Turning now to FIG. 2, key subsystems ("S/S") of pod 120 are illustrated. In a first mode of operation, immediately after separation from the probe vehicle 110, the pod narrowband communications are enabled across the ground link 179 via the ground link subsystem 227. The pod can contain its own detectors 221, but most of the information will likely be obtained via a link subsystem 222 receiving information from the probe vehicle 110. This information is buffered 223 and formatted for signaling via modem 225 using local power 242 and controller 241. As noted above, if there is no high energy x-ray wave front created during the kill, the narrow band subsystem can continue to function until the buffer 223 is emptied or until such other time as the controller 241 stops transmissions.

In order to conserve space, the local and ground link subsystems 222, 227 may be implemented in the same componentry. Where additional space/weight is available, additional auxiliary subsystems 243 may also be included in pod 120, depending on the specific mission design alternatives.

Turning now to the resonant cavity subsystem, a resonant cavity 230 comprises a pick-up element 233 and modulating element 232, which are coupled via leads to wideband (WB) modem 225 and RF feed 235, respectively. In this embodiment, the resonant cavity is made of any one of many appropriate materials that yield electrons when hit by high-energy x-rays. Appropriate materials for space-based cavities would include aluminum and titanium in view of their lightweight. However, those of ordinary skilled in the art will appreciate that a wide variety of materials can be used to achieve the desired recoil electron effect in response to photons incident on the cavity walls. In general, one will likely want to use metals that yield the greatest number of electrons, thus maximizing the energy captured. However, in some cases it may prove desirable to include materials that also dampen the electron yield, and these are also readily available. The cavities may be, conveniently, composed of a solid material such as aluminum. Alternatively, they may be formed of a wide variety of exterior elements in suitable structural arrangement and fill as appropriate, and the material from which the recoil electrons will be generated may even be formed of an internal coating (from metalization, composites, etc.) Those of skill in the art will appreciate that the cavity may be designed to have of the appropriate shapes and materials for creating a resonance at the desired frequency. While the illustrated spherical shape is a convenient one, cylindrical, rectangular, and other shapes may also be used, again depending upon the specific mission(s) contemplated.

When the x-ray wave-front 102 passes the cavity 230, recoil electrons 231 are generated according to the well-known Compton effect. Depending upon the size and shape of the cavity, these recoil electrons will resonate to create a microwave or millimeter wave RF signal. In the case of a nuclear blast, this x-ray wave front will have sufficient intensity to generate a high-power (e.g., over 100 V/m) broadband signal centered around the resonant frequency of the cavity. Although the x-ray wavefront rapidly passes the cavity, the cavity resonance keeps a sustained usable RF signal long enough for a broadband burst. This RF signal acts as a high-power carrier wave, and is modulated by the information signal from modem 225, applied via modulating element 232. In FIG. 2 the modulation element 232 is a circular or spherical element, surrounding RF pick-up 233. The pick-up 233 is excited by the modulated burst, and the antenna of RF feed 235 radiates this wideband burst 236 to the ground or other listening station.

In operation, pod 120 preferably includes an x-ray detector 221. This allows the pod to capture key information based on the characteristics of the x-ray wavefront, as well as to actively trigger the wideband signal modulation. Alternatively, a timer, a detector for disruption of the link signal from the probe vehicle 110, or other appropriate means may be used to trigger modem 225 to begin forwarding information to modulating element 232. When triggered, modem 225 performs a high bandwidth read out of FIFO 223, which will have stored information received from vehicle 110 either before separation (i.e., via a local network download), and/or after separation (e.g., via link 119). Modem 225 in turn modulates that data for wideband transmission. When modem 225 begins sending the data to modulation element 234, RF feed 235 may also be activated to begin transmission of the wideband signal. Alternatively, the pick-up element 233 and RF feed 235 can be arranged to passively react, and could even be designed so transmissions only occur in response to x-ray events above a pre-determined threshold.

As those skilled in the art will appreciate, the resonant cavity 230 creates an IEMP (internal electromagnetic pulse) event with respect to the recoil electrons. Such an x-ray wave front can result in resonant cavity IEMP field levels greater than 100 V/m. Where there is a sufficiently strong x-ray wave-front, similar IEMP events will occur within the other communications circuitry unless sufficiently "hardened" (i.e., designed to withstand the wavefront). Thus, it will be important to ensure sufficient hardening of detector 221, FIFO 223, and wideband modem 225 to achieve the desired modulation if the mission includes use in proximity to high-energy x-ray bursts.

Turning now to FIG. 3, an alternative embodiment of the invention is illustrated in which the resonant cavity is used as a source of power for a local sub-system or a group of sub-systems 320. In this embodiment, the resonant cavity may be designed to respond to other types of photonic events, not just the specific high-energy x-ray form described in connection with the first embodiment. This includes natural sources (the most abundant being solar), or man-made sources (e.g., directed beams), and could be wide- or narrow-beam, in any appropriate band and intensity for producing a sufficient Compton-effect release. As the photons are captured in cavity 330, the resulting recoil electrons again set up a resonant electromagnetic field within the cavity. This time, a collecting element 333 is used to capture the resonant electromagnetic field without modulating the signal. The collecting element 333 can be an antenna (although care will be needed so the shape chosen does not attenuate too much of the resonant signal), a pick-up (such as the spherical pick-up 333 with individual elements 337 appropriately coupled to the inner surface of the sphere 333), or any other appropriate source for capturing energy from the resonating field and/or recoil electrons.

The pick-up 333 is coupled to a suitable power storage device 338. This coupling may be direct via a conductor/wire, e.g., where a direct current is generated on the pick-up that can be applied to a battery. There may also be intermediate elements (e.g., inverters before the batteries; other charger circuitry), or alternative storage (e.g., capacitors/inductors) or conversion (e.g., fuel-cell replenishment) systems, depending on overall system design choices. Power supply 338 would in turn provide power to other subsystems 350, including controller 340 of the unit 320.

This approach would be particularly advantageous in the case of solar probes. Rather than having to rely upon bulky and heavy power storage or generation means within a space ship, or having to rely upon the deployment and maintenance of expensive solar panels, one or more resonant cavities can be employed to provide the power needs of the solar probe. As the probe gets closer to the sun its output would increase, potentially providing all of the energy needed by the probe during operations.

This approach is also useful in miniaturized applications. For example, a variety of in vivo devices like ingestible capsules are now being used for imaging humans and other animals. A variety of micromachines are also being developed that still require electrical power for operation, but only in relatively small amounts. A key challenge in both of these applications is how to provide the local power needed within the size constraints. By using a miniature resonant cavity, matched for counterpart high frequency inputs to the pick-up 333 and converters/store 338, it is now possible to provide substantial—or even all—power for the miniature devices 320 via the remote/wireless external sources 302 or 303.

FIG. 4, illustrates how different resonant cavities, like those described in the first and second embodiments above, can be advantageously combined so as to provide both local power and wideband communications capabilities. In this case, the first resonating cavity 432 would be used to keep the power supply 434 sufficiently charged for the operation of onboard systems; alternatively, it could provide all the power needed for device operations. In large systems, these other subsystems might include detectors, scientific equipment for observation of solar phenomena, controller and processors, and modulating elements (such as shown for modulating the second resonant cavity 422). In smaller devices, there may be nothing more than a coupled power and simple modulation system present.

Two other exemplary applications of this combined system are rescue beacons and RF tags. A first photonic source, at a first wavelength, might be used to excite simple power and modulation sources 434, 436 via the first cavity 432—enough to apply a unique modulation code (preferably a digital signature) to the second cavity 422. Photons at a second wavelength would, at the same time, excite a carrier wave within the second cavity 422, which is in turn modulated with the predetermined code and radiated via element 424. In this manner, very small devices can be used to provide reliable information when irradiated, without the necessity of local power. This frees designers from the concerns over the reliability of local power supplies (e.g., having sufficient shelf life, or power to last during unexpectedly long periods of use). It also provides flexibility in designing application specific tags—e.g., so they only respond to a unique multi-wavelength photonic source, at particular thresholds, or even (if more cavities are used) with predetermined trigger patterns. The responsive signal would in turn be uniquely encoded, allowing for ease of identification of the beacon or tag.

Many other alternatives are possible. In the case of miniature detectors, the resonant cavity subsystems could be advantageously combined with still other detectors, whether passive (e.g., chemically activated) or active (dependent on power supply 434). The passive detectors can collect information even when electronic subsystems are out of power (e.g., determining whether a threshold exposure has occurred). Even if in a sealed container, the power supply 434 could be periodically charged to support active detectors. In this way, remote detection at periodic checkpoints is enabled, allowing polling for any detected (whether passively or actively) target or event by the system 420. If a strong enough source 402 and radiated signal is supported, the listening devices could even be implemented in distant (e.g., airborne or even satellite) systems.

Moreover, a resonant cavity could itself serve as a detector. One such example is when a cavity-detector is used to detect the presence of x-rays indicative of low-level nuclear material. If coupled with other remotely powered and communications-capable resonant cavities, such miniature units 420 could be inconspicuously dispensed in warehouses, shipping containers, and practically any other facility or containment device in order to help detect the presence of radioactive material. A simple detector might simply keep a count or other cumulative measure of the amount of radiation detected above a threshold (e.g., for background radiation). A key advantage in such an approach is that the detection can occur via an inconspicuous and low powered unit 420, but then remotely interrogated so inspectors or automated checkpoints can rapidly determine if something requiring further investigation is present.

Figure 5:
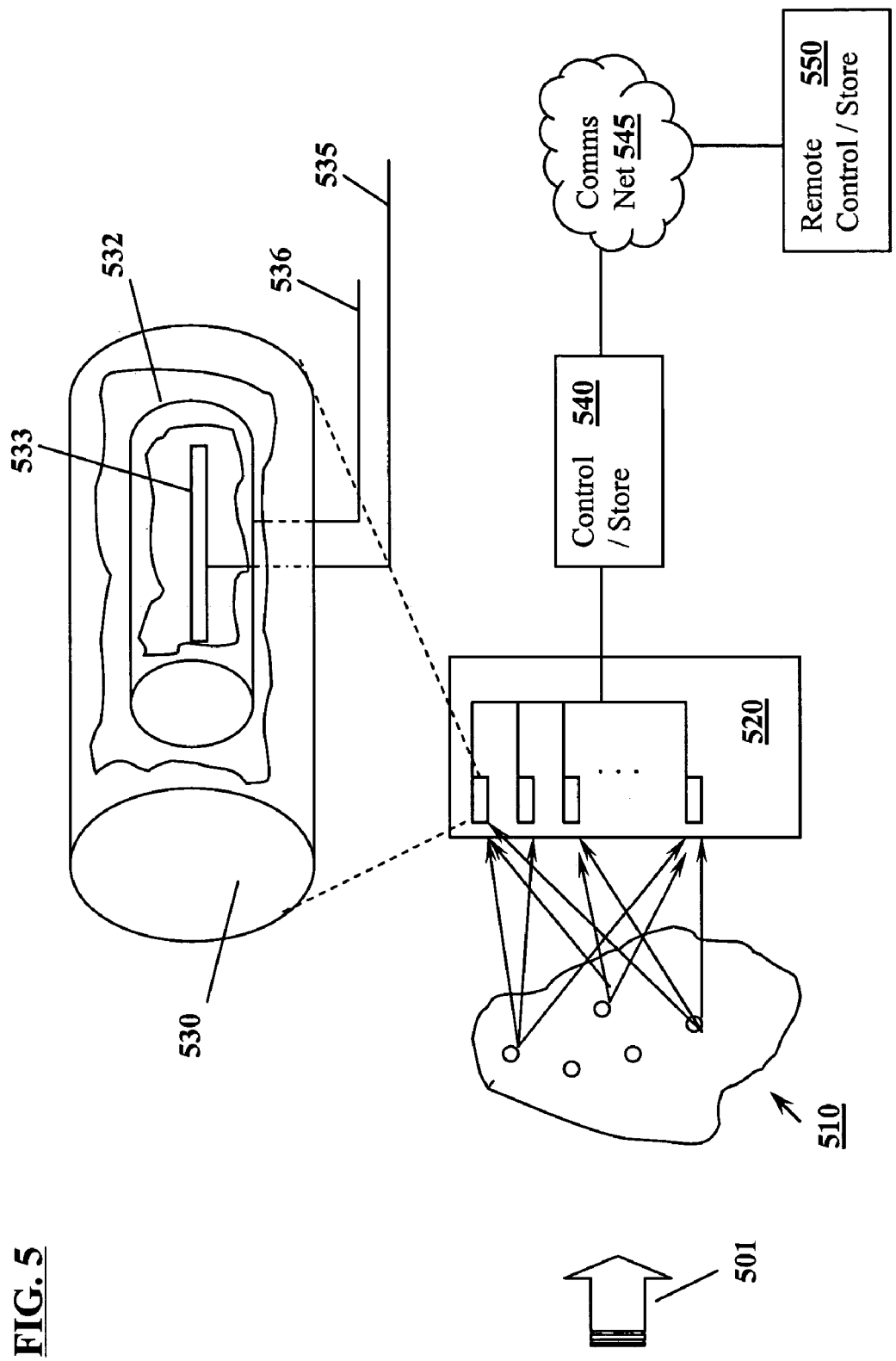
FIG. 5 is a block diagram illustrating an array of resonant cavities used according to a fourth embodiment of the invention.

FIG. 5 contains a further illustration of an application of an array of resonant cavities 520 useful in providing a passive or low power detection and localization of objects 510. Each of the array members 520 includes a resonant cavity 530, a pick-up element 533 and an output 534. A variety of different shapes and resonant frequency tuned cavities 530 can be provided in order to detect objects across a broad spectrum. Further cavities 532 can be used to filter (e.g., at a predetermined frequency and/or directional orientation) the incident photons. By this arrangement, very fine directional resolution of low power sources can be achieved. The cavities enhance the incident photons at the determined wavelength(s). Any of a variety of well-known post-processing techniques, such as used in smart antennas or phased array sonar or radar systems, can be applied at control 540 or 550 to achieve the desired spatial and temporal resolution.

While this can be useful in detecting objects 510 that are radiating by themselves or by local effects, it may be particularly useful in detecting objects that radiate in response to a radiation pulse 501. This could be implemented, for example, together with miniature detectors 420 described above in connection with FIG. 4. The array 520 could be stationary (e.g., at a checkpoint) or mobile (e.g., airborne), as could the radiating source (whether on the same platform as the array, or on a separate platform like a satellite) as well as the miniature detectors 420. Alternatively, since many other types of materials and components may reflect or generate known photonic signatures in response to specific electromagnetic radiation 501, objects 510 might represent any such type of material that radiates at a sufficient level to be useful in this type of detection system. They could also be embedded on the surface of larger objects. Further, because the detectors can be implemented in miniature arrays, they can be added to virtually any type of apparatus or material, whether for large units or for use by independent field operators. Then, by using controlled sources at known locations 501, one can illuminate any of these objects of interest 510 in such a manner to create detectable and localizable sources of radiation. All this can be accomplished without the target being alerted to the presence of the detectors.

One skilled in the art will appreciate from the foregoing discussion that there are a wide variety of applications for resonant cavities in accordance with the present invention. Those described above in connection with the illustrated four embodiments of FIGS. 2–5 are merely illustrative of the variety that is possible. Whether used individually as a detector, as a means for capturing power, or as a means for amplifying other signals or modulating communication signals, and whether singularly or in combination with other types of resonant cavities, numerous other applications are now made possible and within the scope of our invention. Matters such as size, shape, and the particular materials used in connection with the design of particular resonant cavities is matter of straightforward design choice, depending upon the particular applications in mind, in further view of the nature of the source, recoil electrons and electromagnetic resonance desired.

In conclusion, the above description has been presented for purposes of illustration and description of an embodiment of the invention, but is not intended to be exhaustive or limited to the form disclosed. This embodiment was chosen and described in order to explain the principles of the invention, show its practical application, and to enable those of ordinary skill in the art to understand how to make and use the invention. Many modifications and variations will be apparent to those of ordinary skill in the art. Thus, it should be understood that the invention is not limited to the embodiments described above, but should be interpreted within the full spirit and scope of the appended claims.

We claim:

1. A photon energized cavity system comprising:

a resonant cavity comprising a cavity wall, the cavity wall comprised of a preselected material operable for generating recoil electrons in response to photons of a predetermined wavelength, and a shape operable to resonate at a predetermined resonant frequency when said recoil electrons are generated;

an EM (electromagnetic) pick-up inside the cavity, operable for capturing EM output at the predetermined resonant frequency and feeding the EM output to an external device.

2. The system of claim 1, comprising:

a data source; and a modulating element inside the resonant cavity and coupled to the data source, whereby data from the data source is operably applied to the modulating element to modulate a carrier wave at the predetermined resonant frequency when the cavity resonates so the EM output is a modulated data signal.

3. The system of claim 2, wherein the data source is a modem comprising a broadband modulator, and the external device is a wideband RF feed and antenna coupled to the EM pick-up, the preselected material is capable of generating recoil electrons in response to x-rays, and the EM output is a modulated broadband signal.

4. A communications unit including a cavity system according to claim 3, further comprising:

a communications link coupled to the modem comprising a receiver operable for receiving data from another device proximate to the communications unit, a narrowband RF feed and antenna coupled to the modem, wherein the modem further comprises a narrowband modulator.

5. A space-borne monitoring system comprising a main system and a separable communications unit according to claim 4.

6. The system of claim 5, wherein the main system is an intercept missile for nuclear warheads, operable for separating the communications unit prior to intercept, whereby the communications link is operable for receiving intercept data from the intercept missile and the cavity is operable, in response to x-rays from a nuclear detonation, to modulate the carrier wave with the intercept data to transmit a broadband data burst to remote units.

7. The system of claim 2, wherein the preselected material is one of the group of aluminum and titanium, and the cavity is one of the group of a sphere, an ellipsoid, and a cylindrical shaped structure.

8. A photon energized power supply apparatus comprising:
   a resonant cavity comprising a cavity wall, the cavity wall comprised of a preselected material operable for generating recoil electrons in response to photons of a predetermined wavelength, and a shape operable to resonate at a predetermined resonant frequency when said recoil electrons are generated;
   an EM (electromagnetic) pick-up inside the cavity, operable for capturing EM output at the predetermined resonant frequency; and
   a power store coupled to the EM pick-up, operable for receiving the EM output and converting the EM output to energy for use by other devices.

9. The apparatus of claim 8, wherein the EM output is electrical and the power store comprises a battery.

10. The apparatus of claim 8, wherein the power store comprises an electrical conversion unit.

11. A space vehicle including the power supply apparatus of claim 8, wherein preselected material is operable for generating recoil electrons in response to solar x-rays and the EM output is electrical, the space vehicle further comprising a communications unit powered via the electrical conversion unit.

12. A remotely-powered communications apparatus comprising:
   (a) a first resonant cavity comprising a first cavity wall, the first cavity wall comprised of a first preselected material operable for generating recoil electrons in response to photons of a first predetermined wavelength, and a shape operable to resonate at a first predetermined resonant frequency when said recoil electrons are generated;
   a data source;
   a modulating element inside the first resonant cavity and coupled to the data source, whereby data from the data source is operably applied to the modulating element to modulate a carrier wave of the first predetermined resonant frequency when the cavity resonates; and
   an RF pick-up inside the first cavity, operable for capturing RF output at the first predetermined resonant frequency and feeding the RF output to an external device; and
   (b) a second resonant cavity comprising a second cavity wall, the second cavity wall comprised of a second preselected material operable for generating recoil electrons in response to photons of a second predetermined wavelength, and a shape operable to resonate at a second predetermined resonant frequency when said recoil electrons are generated;
   an EM (electromagnetic) pick-up inside the second cavity, operable for capturing EM output at the second predetermined resonant frequency; and
   a power supply coupled to the EM pick-up.

13. The apparatus of claim 12, wherein the power supply is a level detector operable for receiving and storing the EM output based on an amount of photons of the second predetermined wavelength received at the apparatus, and the data store is coupled to the level detector operable for storing an indicative value of said amount of photons and applying said value to the modulating element, and the external device is a radiating element, whereby the RF output is modulated with the indicative value.

14. An RF tag including the apparatus of claim 12, wherein the power supply is coupled to the data store, the data store being operably configured to store identifying information and, when powered by the power supply, apply the identifying information to the modulating element, and the external device is a radiating element, whereby the RF output is modulated with the identifying information.

15. A detection system, comprising an array of resonant detectors, each of a set of first detectors each comprising:
   a first resonant cavity comprising a first cavity wall, the first cavity wall comprised of a first preselected material operable for generating recoil electrons in response to photons of a first predetermined wavelength, and a shape operable to resonate at a first predetermined resonant frequency when said recoil electrons are generated; and
   an RF pick-up inside the first cavity, operable for capturing RF output at the first predetermined resonant frequency and feeding the RF output to a data store.

16. The system of claim 15, each of the plural set of first detectors further comprising a further resonant cavity inside the first resonant cavity and surrounding the RF pick-up, the further resonant cavity comprising a further cavity wall, the further cavity wall comprised of a further preselected material and shape operable for directionally filtering RF signals resonating within the first resonant cavity.

17. The system of claim 15, further comprising a set of second detectors each comprising a second resonant cavity comprising a second cavity wall, the second cavity wall comprised of a second preselected material operable for generating recoil electrons in response to photons of a second predetermined wavelength, and a shape operable to resonate at a second predetermined resonant frequency when said recoil electrons are generated; and
   a further RF pick-up inside the second cavity, operable for capturing further RF output at the second predetermined resonant frequency and feeding the further RF output to a data store.

18. The system of claim 15, further comprising a processor operable for processing the RF outputs from the set of first detectors, including phase and timing information, to determine the location of a remote object.

19. A method for capturing photon energy using a resonant cavity, comprising:
   a) generating recoil electrons in a resonant cavity based on photons of a predetermined wavelength, the cavity comprising a cavity wall of a preselected material operable for forming recoil electrons;
   b) resonating an EM signal generated by the recoil electrons within the resonant cavity; and c) capturing an EM output at the predetermined resonant frequency by a EM pick-up inside the cavity, and feeding the EM output to an external device.

20. The method of claim 19, comprising:
   d) coupling data from a data source to a modulating element inside the resonant cavity; and
   e) modulating the EM signal, so the EM output is a modulated data signal.

21. The method of claim 20, wherein the photons are x-rays, and the step of generating comprises generating recoil electrons in response to the x-rays, and the step of modulating comprises forming the EM output into a modulated broadband signal.

22. The method of claim 21 used in a communications unit, further comprising:
   f) communicating with another device proximate the communications unit via a communications link operably coupled to the data source; and
   g) transmitting data via a narrowband RF feed coupled to the data source until a predetermined level of photons of the predetermined wavelength are received at the communications unit.

23. The method of claim 22, wherein the communications unit is part of a space-borne monitoring system comprising a further main system, and step f) comprises transceiving data from the main system to the communications unit.

24. The method of claim 23, wherein the main system is an intercept missile for nuclear warheads, further comprising:
   h) separating the communications unit prior to intercept and performing step f) after separation, and
   i) in response to x-rays from a nuclear detonation, modulating the carrier wave with the intercept data to transmit a broadband data burst to remote units.

25. A communications method comprising:
   a) generating first recoil electrons in a first resonant cavity from photons of a first predetermined wavelength, the first cavity comprising a cavity wall of a first preselected material and shape;
   b) resonating an EM signal at a first predetermined resonant frequency, the EM signal being generated by the recoil electrons within the resonant cavity; and
   c) capturing an EM output at the first predetermined resonant frequency by a EM pick-up inside the cavity, and feeding the EM output to a power supply;
   d) generating second recoil electrons in a second resonant cavity from photons of a second predetermined wavelength, the second cavity comprising a cavity wall of a second preselected material and shape;
   e) resonating an RF signal at a second predetermined resonant frequency, the RF signal being generated by the recoil electrons within the resonant cavity;
   f) modulating the RF signal with data from a data source via a modulating element in the second resonant cavity; and
   g) capturing a modulated RF output at the second predetermined resonant frequency by an RF pick-up inside the cavity, and feeding the RF output to an external apparatus.

26. The method of claim 25, further comprising:
   h) receiving and storing the EM output at the power supply based on an amount of photons of the first predetermined wavelength received at the apparatus, the power supply also operating as a detector; and
   i) operably coupling the data store and detector, and storing an indicative value of said amount of photons and applying said value to the modulating element, whereby the RF output is modulated with the indicative value.

27. A method of identifying an RF tag using the method of claim 25, further comprising:
   h) storing RF tag identifying information in the data store;
   i) operably coupling the data store and power supply, powering the data store, and applying the identifying information to the modulating element, whereby the RF output is modulated with the identifying information.

28. A method for locating an object using an array of photon energized resonant detectors, comprising:
   a) in each of a set of first detectors, each comprising a first resonant cavity comprising a first cavity wall, the first cavity wall comprised of a first preselected material,
      1) generating recoil electrons in response to photons of a first predetermined wavelength, and the recoil electrons generating an RF signal resonating at a first predetermined resonant frequency; and
      2) capturing RF output via an RF pick-up inside the first cavity, and feeding the RF output to a data store.

29. The method of claim 28, further comprising the step of directionally filtering, via a further resonant cavity, RF signals resonating within the first resonant cavity.

30. The method of claim 28, further comprising:
   b) in each of a set of second detectors, each comprising a second resonant cavity comprising a second cavity wall, the second cavity wall comprised of a second preselected material,
      1) generating further recoil electrons in response to photons of a second predetermined wavelength, and the further recoil electrons generating a further RF signal resonating at a second predetermined resonant frequency; and
      2) capturing further RF output via a further RF pick-up inside the second cavity, and feeding the further RF output to the data store.

* * * * *